United States Patent
Natali

[11] Patent Number: 5,960,526
[45] Date of Patent: Oct. 5, 1999

[54] PROCESS FOR FORMING CIRCUIT BOARD SUPPORTS ON METAL SHEET FRAMES FOR PERSONAL COMPUTERS

[76] Inventor: Gianfranco Natali, 1, Via Roma, I-06019 Montone (PG), Italy

[21] Appl. No.: 09/035,834

[22] Filed: Mar. 6, 1998

[30] Foreign Application Priority Data

May 16, 1997 [IT] Italy ................................ AR97A0019

[51] Int. Cl.⁶ ............................. B21D 31/04; H05K 7/14
[52] U.S. Cl. ..................... 29/6.1; 312/263; 312/265.5; 312/257.1; 361/747; 361/759; 361/799; 361/801
[58] Field of Search .................... 29/6.1; 361/747, 361/759, 799, 801, 802; 312/263, 265.5, 257.1

[56] References Cited

U.S. PATENT DOCUMENTS

| | | |
|---|---|---|
| 3,111,204 | 11/1963 | Phare . |
| 3,497,928 | 3/1970 | Coen .......................... 29/6.1 |
| 3,618,185 | 11/1971 | Coen .......................... 29/6.1 |
| 3,884,646 | 5/1975 | Kenney .................... 29/191.4 |
| 3,946,896 | 3/1976 | Lemelson .................... 220/53 |
| 4,371,154 | 2/1983 | Winbgler .................... 29/512 |
| 4,519,960 | 5/1985 | Kitterman et al. .......... 29/6.1 |
| 4,748,841 | 6/1988 | Mezger et al. ............... 29/882 |
| 4,776,251 | 10/1988 | Carter, Jr. .................... 83/835 |
| 5,392,629 | 2/1995 | Goss et al. ................... 29/6.1 |

Primary Examiner—S. Thomas Hughes
Assistant Examiner—John Preta
Attorney, Agent, or Firm—Young & Thompson

[57] ABSTRACT

The invention consists of a process to form low stretch-deep draws on metal sheet; it foresees an initial stage through which a sequence of thread-like cuts (2) are carried out on the metal sheet (1) corresponding to the surface that will be drawn, whose cuts (2) on the adjacent lines are offset compared with each other, a stage in which the metal sheet (1) is stretched, through which stage the opening of the cuts (2) is obtained, therefore an ample widening of the cut surface and a minimum stretching of the non cut surface and of the oblique stripped metal network, separating the empty spaces (3) obtained through the widening of the thread like cuts (2), and where necessary, a stage in which the metal sheet is bent along a line which allows, on the overlapped surfaces, the open spaces of one surface to correspond to the strips on the other surface in order to reduce or close the width of the spaces in order to reduce electromagnetic interferences.

3 Claims, 2 Drawing Sheets

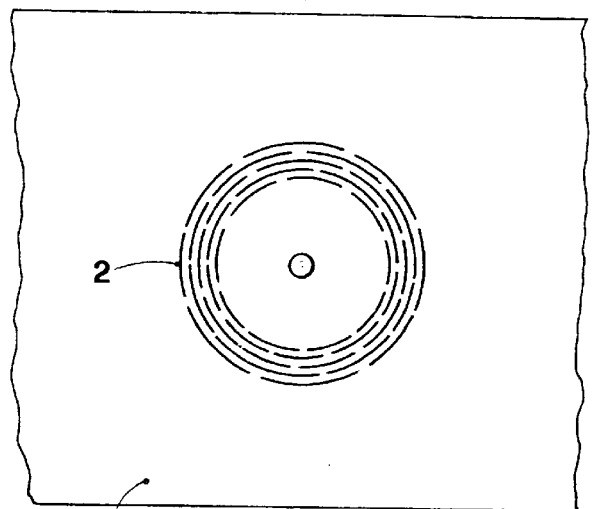
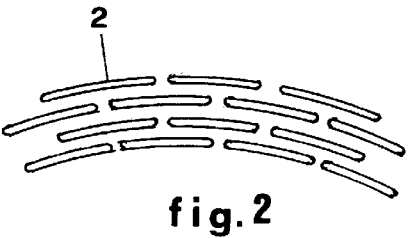
fig. 1
fig. 2
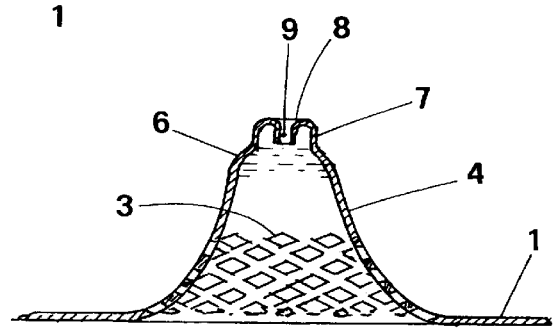
fig. 3
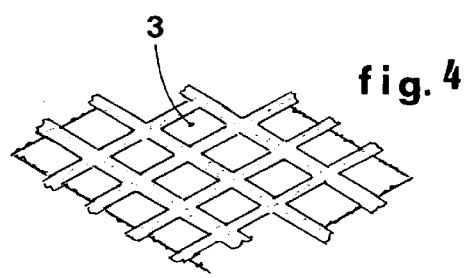
fig. 4
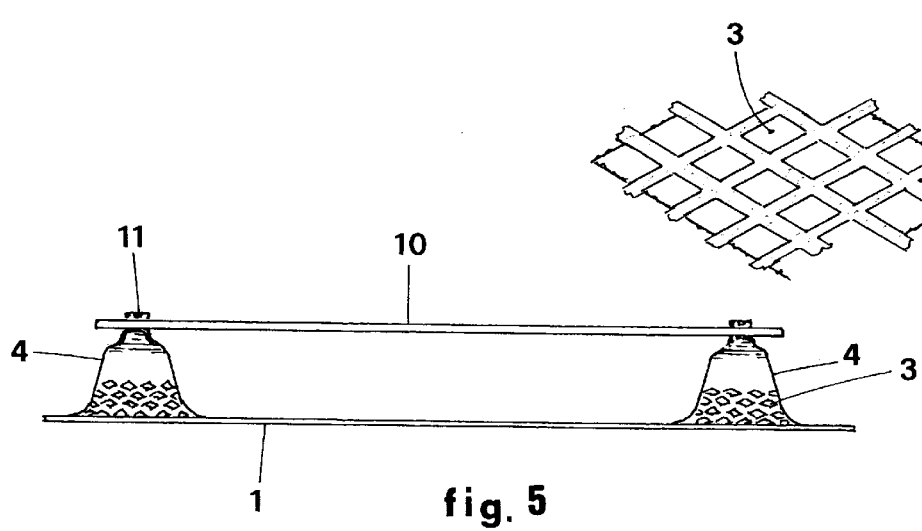
fig. 5

PROCESS FOR FORMING CIRCUIT BOARD SUPPORTS ON METAL SHEET FRAMES FOR PERSONAL COMPUTERS

BACKGROUND OF THE INVENTION

1. Field of the Invention

The invention is a process for forming deep draws on metal sheet frames for personal computers, through which to carry out supporting and anchoring protrusions, and highly recessed or protruding surfaces.

2. Description of the Related Art

When building personal computers, metal sheet frames are normally used. Inside these frames electronic circuitries assembled on a board are placed close to their base. They are held in place, uplifted over the base of the frame, by means of metal inserts. These metal inserts have a threaded axial hole which can be coupled with a screw to fix the electronic circuit board onto these metal inserts. The edge of these supporting inserts, usually at the base, is shaped and dimensioned in such a way as to be press fixed onto a corresponding hole on the sheet forming the base or, generally, onto the surface of the main metal frame. This process makes it necessary for gauged holes to be made on the frame for the placing of the metal inserts, the production or buying of these metal inserts and their press fixing onto the gauged holes so that they are permanently fixed onto the frame in order to maintain their position rigidly to allow the correct positioning of the electronic board on them and to allow for each metal insert the application of a screw with which to stabilize the same electronic board on the frame. The creation of the hole and the application of the press-on metal insert on it are both operations requiring maximum precision, so that their press-on coupling and the orientation of the insert is highly stable over time. The coupling must therefore be such as to eliminate any possibility of movement of these inserts, especially when they are quite long and therefore when the electronic board must be placed high over the base of the frame which contains it, to allow a precise application of the blocking screws, which is often carried out with the aid of robots, eliminating any need for corrections, in order to reduce assembly costs.

Presently, the metal frame of common personal computers has a wide opening on one side, closed by a sheet element called "board panel", having a box-like shape and equipped with a number of holes and slots. Its construction still requires the wide opening on its frame, the making of a separate steel sheet box-like structure and their coupling and fixing together by welding. All this constitutes a complex process which takes part in the definition of the global high cost of the frame.

SUMMARY OF THE INVENTION

The object of this invention is to find a process that allows plastic deformations of the metal frame that contains the electric and electronic circuits of the personal computer. In one case, the aim of these deformations is to eliminate the use of the inserts that are used as separating and supporting elements of the electronic board applied parallel to the base of the same frame. In another case, these deformations are aimed at eliminating the need to apply the steel sheet box-like structure which originates the "board panel". A process that will allow obtaining such results will be very advantageous for a number of reasons: in the first case it will allow the elimination of supporting and sustaining inserts that have a separate cost and also require a specific organization to buy and produce them, for their stockage and their use on assembly lines. The creation of protrusions—equivalent to the inserts—on the bottom of the frame will ensure that the anchoring points have a stable position, therefore the electronic board will be properly placed inside them. It will also allow a perfect alignment of the fixing holes on the electronic board with those on the protrusions, to allow the application of screws.

In the second case the disadvantages due to the use of a separate steel box-like structure will be eliminated, therefore, all the problems related to the production, stockage and production line of the separate box will be simplified, as above said for the inserts. It will also eliminate the problems related to the welding together of the main metal frame to the box-like structure, the problems related to the insulation with paints or other equivalent materials of the overlapped welded parts, where it is difficult to entirely coat these overlapped surfaces to avoid the formation of rust and therefore corrosion of the parts attacked by rust.

On the other hand, through the prior art procedures, the deformation by drawing the steel with which the main frame is made does not appear possible in some cases due to the length of the inserts that constitute the supporting bases of the electronic board and due to the depth of the base of the "board panel" compared to the side of the frame on which it is placed. A drawing process carried out with the prior art methods would determine an excessive stretch of the metal, and its inevitable tear. Furthermore, the external protection of the pre-painted sheet with which the main frame is produced would come off. Applying the prior art technology would therefore bring forth mechanical problems (breakage due to stretching and tearing of the sheet) on one hand, and aesthetic problems (abrasion of the stretched surfaces and removal of the protective paint, with the consequent oxidation and rusting of these surfaces) on the other.

This invention, which allows overcoming the above described technical problems, consists of a process in which low stretch-deep draws are formed on the metal sheets with which frames for personal computers are made. It foresees an initial stage through which a sequence of lines of thread-like cuts are carried out on the metal sheet corresponding to the surface that will be drawn, whose cuts on the adjacent lines are offset compared with each other, a second stage in which the metal sheet is stretched, through which stage the opening of the cuts is obtained, therefore an ample widening of the cut surface and a minimum stretching of the non cut surface and a minimum stretch of the oblique stripped metal network, separating the empty spaces obtained through the widening of the initially thread like cuts, and where necessary, a third stage in which the metal sheet is bent along a line which originates the overlap of two sheets in which, the open spaces of one surface correspond to the strips of the network on the other surface in order to reduce or close the width of the holes on the folded sheet, in order to reduce electromagnetic interferences, that is the passage of electromagnetic waves through the two overlapped sheet surfaces.

BRIEF DESCRIPTION OF THE DRAWINGS

The above process will be easily understood by following the detailed description herebelow and the drawings of the enclosed table that exemplify the preferred embodiments of the invention, and in which:

FIG. 1 is the front view of a portion of steel sheet on which thread-like cuts have been carried out following a pattern of concentric circular lines;

FIG. 2 is the enlarged view of some adjacent thread-like cuts, through which their reciprocal positioning is highlighted;

FIG. 3 is the sectional view of the elevated portion of sheet as in FIG. 1, after it has been drawn, originating a protrusion with a shaped profile;

FIG. 4 is the enlarged view of some adjacent cuts after having been deformed by the drawing process;

FIG. 5 is the side view of the elevation of a sheet on which two protrusions have been carried out and on which a plate has been placed and fixed on with screws;

Figure 6:
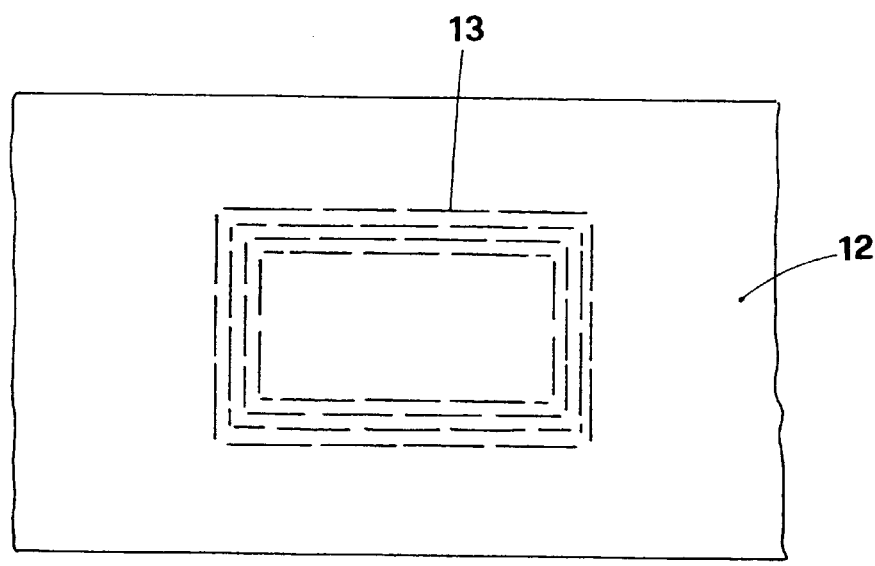
FIG. 6 is the plan view of a portion of steel sheet on which a number of thread-like cuts has been carried out, following a pattern of almost rectangular lines, one inside the other, and whose cuts are offset.

It is understood that the drawings have a demonstrative character and are presented exclusively as an illustration of the object of the invention in question without in any way constituting a limitation.

DESCRIPTION OF THE PREFERRED EMBODIMENT

In the drawings 1 indicates the portion of sheet of a base of the steel frame of the personal computer, 2 indicates the thin cut lines forming concentric arches, 3 indicates the slots formed after the deformation of lines 2, 4 indicates the protruding shape of the drawn protrusion, 6 indicates the shoulders of the protrusion, 7 indicates the slightly truncated cone top, 8 indicates the top, 9 indicates the recessing part which originates a sort of tubular trunk, 10 indicates the plate which is anchored to various protrusions and 11 indicates the anchoring screws.

Figure 7:
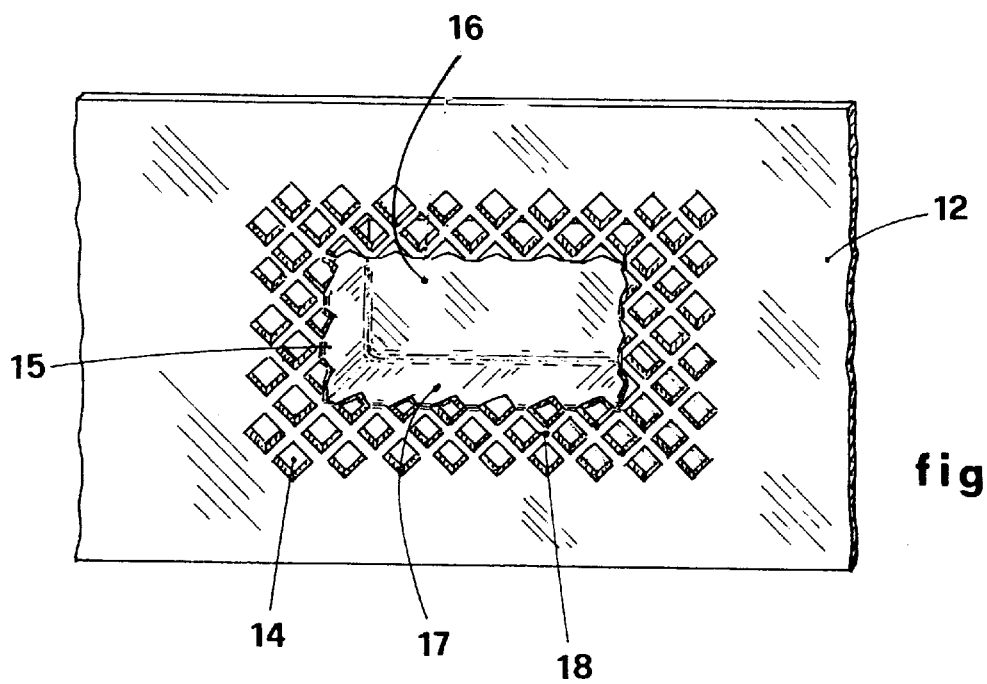
FIG. 7 is the top view in perspective looking from the right hand side of the sheet shown in FIG. 6, after it has undergone the drawing process.

With reference now to FIGS. 6 and 7, 12 indicates a portion of sheet on a side of the personal computer's frame 13 indicates thread-like cuts placed following a rectangular pattern, 14 indicates the slots obtained with the deformation of cuts 13, 15 indicates the deep print or recess on sheet 12, 16 indicates its base, 17 indicates the sides of recess 15, 18 indicates the strips of the network of the sheet after it has been deformed, which separate the slots 14 one from the other.

Therefore, the invention concerns the process through which it is possible to carry out deep draws on the base 1 of the metal frame that will house computer and personal computer electric and electronic circuitries. The deep draws originate specific protrusions 4 on the top 8 of which, plate 10, that carries the part/parts of the computer's electronic circuits, is placed and fixed. The invention also concerns the process through which on one or both sides of the above mentioned frame, deep drawn recessed prints 15 are produced with a minimum stretching of the metal, in a way that the metal undergoes slight superficial stress, without damaging the coat of paint or other equivalent substance that protects the frame from external agents (corroding agents, pollution).

This process consists of a stage in which the frame sheet is prepared for the drawing deformation. This stage consists in cutting on surface 1—that will be drawn—a number of lines of thread-like cuts 2, the cuts on adjacent lines being offset between each other, so that after they undergo the plastic deformation, an oblique stripped metal network is obtained.

These thread-like cuts 2, on sheet 1, may be carried out with various techniques. It is preferable to use laser rays because of their higher precision and minimum width of the cut 2, this allows wider openings of the sheet corresponding to these cuts and a modest stretch of the network that delimits the opened cuts, all of which through modest mechanic stress. The very thin shape of the cuts 2 makes it possible for a higher number of cuts to be carried out on said surface, therefore more lines of cuts next to each other, which make it possible for the cut surface to be distorted by drawing it, into a net like structure having oblique strips. By adjusting the intensity of the stress it is possible to change the intersecting angles, this makes it possible to obtain different stretching on the cut sheet, through a minimum pull on the metal.

In order to be advantageous, the distance between the thread-like consecutive cuts 2 on each line should be even: this will evenly distribute resistance to distortion over the entire surface covered by cuts, and will produce their even dilation. It is also advantageous that the separation between each subsequent cut of the same line corresponds to the middle of the cuts on the adjacent lines. This way it is possible to obtain a uniform distribution of the metal network and a higher distortion and therefore a higher stretch of surface 1, applying the same amount of mechanical stress. Mechanical stress and distortion carried out with the help of a punch and a corresponding drawing die, both shaped, through which the sheet with lines of thread-like cuts 2 is usually distorted by steps, i.e. distortions that normally involve different parts are carried out at different times, the last deforming action is the one that widens the thread-like cuts 2 to originate the metal network.

All the above simplifies the forming of shaped plastic forms, as the ones exemplified in FIGS. 3 and 5 of the enclosed drawing table. In that case, the first stage is to draw the center of the surface that will form the protrusion 4, the effect will be to produce a tubular trunk 9, that can be coupled with screws 11. After which the punch and the drawing die come into action to produce the plastic distortion on plate 1 with which the supporting surface 8 and the truncated cone structure 7 are formed. This last structure 7 limits the contact, between the plate 10 that must be sustained and the support 4 below, exclusively with surface 8. Said top structure is necessary to support plate 10 which is blocked with screws 11, that are normally of a self-threading type, interacting with the tubular trunk 9 of the sustaining structure underneath.

The following stage concerns the distortion of the sheet forming the shoulder 6 reproduced in the example in figures from 1 to 5, therefore the surface with thread-like cuts 2 undergoes a considerable stretching due to the widening of the cuts 2. The last deforming action first determines the stretching of the sheet around the shoulder 6, then the widening of the thread-like cuts 2 and the production of the metal network with holes 3 and the elevation over the plate 1 of protrusion 4. By changing the number of concentric lines of thread-like cuts 2, it is possible to change the height of the protrusions 4, without noticeable thinning of the metal that forms the network.

In the solution reproduced in FIGS. 6 and 7, the plastic distortion stage, through punch and drawing die, concerns the surface 12 prepared with rectangular lines of thread-like cuts 13. The drawing process forms a recessing base 16 having deep sides 17, whose shaping pulls on the metal from the outside of the same sides and therefore the widening of the cuts 13 that turn into diamond shapes 14. This allows the metal to slide towards the sides 17 where it is drawn during the drawing stage. During said stage the network structure, therefore the openings 14 may also reach sides 17 according to the drawing depth and the wideness of the crown of cuts 13 made on the sheet 12. In some cases it is necessary to bend the edges around the drawn structure. In the case in which the openings 14 are also on the sides 17, the process makes it necessary to bend, parts of the surface having the distorted cuts 14, over the remaining part also covered with distorted cuts so that the strips of the network on one edge overlap the openings 14 on the other edge, blocking and eventually closing the holes and in any case the blockage must create an obstacle to the passage of electromagnetic waves through the holes on the same surfaces.

The cuts 13 that allow the widening of the stressed surfaces may also not be cut, i.e., substituted by lines of incisions having a depth that will allow the metal at their bottom to tear when the sheet is stretched during the drawing process.

I claim:

1. A method of making a computer frame comprising the steps of:

locating plural spaced apart circuit board mounting positions on a metal sheet that will form the computer frame;

at each of the mounting positions, cutting the metal sheet with plural concentric annular cuts, each of the annular cuts including plural arcuate cuts that are separated by uncut gaps, where the gaps in one of the annular cuts are offset from the gaps in an adjacent one of the annular cuts;

at each of the mounting positions, providing a center hole at an axial center of the annular cuts, where a space between the center hole and a radially innermost of the annular cuts defines an uncut annular surface;

at each of the mounting positions, depressing a periphery of the center hole and crimping the depressed periphery to form a tubular trunk;

at each of the mounting positions, stretching the annular cuts and deforming the uncut annular surface to form a bell-shape wherein the annular cuts curve away from a plane of the metal sheet at an open end of the bell-shape and the uncut annular surface is oblique to the plane of the metal sheet at sides of the bell-shape adjacent a closed end of the bell-shape; and mounting a circuit board on the bell-shape of at least two of the mounting positions with fasteners that extend through and are secured to the respective tubular trunks.

2. The method of claim 1, wherein the uncut annular surface at each mounting position is substantially perpendicular to the plane of the metal sheet at the sides of the respective bell-shape adjacent the closed end of the respective bell-shape.

3. The method of claim 1, wherein a peripheral wall of said tubular trunk at each mounting position has a thickness double that of the sheet metal.

* * * * *